July 17, 1956

W. A. FULLER 2,755,448

TUNING UNIT

Filed June 30, 1952

INVENTOR.
WENDELL A. FULLER.
BY
Mason, Kolehmainen, Rathburn & Wyss
ATTORNEYS.

United States Patent Office 2,755,448

Patented July 17, 1956

2,755,448

TUNING UNIT

Wendell A. Fuller, Bloomington, Ind., assignor, by mesne assignments, to Sarkes Tarzian, Inc., Bloomington, Ind., a corporation of Indiana Application June 30, 1952, Serial No. 296,425

4 Claims. (Cl. 333—82)

The present invention relates to a tuning unit for use in tuning the input circuit of a television receiver, and more particularly, to tuning units which are suitable for tuning television receivers continuously over the ultra high frequency television band of 470 megacycles to 890 megacycles.

With the advent of the ultra high frequency television band there is a great need for a tuning unit which is of relatively simple construction, small size and low cost and which is adapted continuously to tune the television receiver through the relatively wide band of frequencies contained within the ultra high frequency television band. One of the problems encountered in the design of a suitable tuning unit of the type described above is that of properly shielding the tuning unit so that the tuning unit is not affected by the adjacent circuits in the television receiver and conversely so that energy produced within the tuning unit itself is not radiated and cannot cause disturbances in other television or radio receivers near by.

Accordingly, it is an object of the present invention to provide a new and improved tuning unit which is adapted to tune the input circuit of a television receiver to any one of the television stations in the ultra high frequency television band, and which is of relatively small size, simplified construction and low cost.

It is another object of the present invention to provide a new and improved tuning unit for the ultra high frequency television band which is completely shielded to prevent pick-up by the tuning unit itself and to prevent radiation therefrom.

It is a further object of the present invention to provide a new and improved tuning unit for the ultra high frequency television band which is completely shielded to prevent pick-up by the tuning unit and wherein spurious modes of oscillation within the shielded tuning unit are prevented.

Briefly, in accordance with one phase of the present invention, the tuning unit comprises means defining a resonant cavity having the walls thereof formed of a conductive material and a set of stator condenser plates are electrically connected to one wall of the cavity at the central portion thereof. A set of rotor condenser plates arranged to interleave with the stator plates in variable capacitive relation are electrically connected to the opposite wall of the cavity at the central portion thereof. The stator and rotor plates, together with the walls of the cavity, form a tuned circuit the resonant frequency of which may be varied throughout the ultra high frequency television band by rotation of the rotor plates. Energy is coupled into and extracted from the tuned circuit by means of coupling loops extending into the cavity and positioned adjacent the rotor and stator plates. The natural resonant frequency of the cavity considered independently of the rotor and stator plates and supporting means therefor, is sufficiently higher than the highest frequency in the ultra high frequency television band so that spurious modes of oscillation are prevented from being set up within the cavity upon coupling of energy to the tuned circuit therein. In accordance with a further feature of the invention, two or more of these tuning units may be coupled together in ganged relation and the position of the coupling loops connecting the two tuning units may be varied simultaneously with rotation of the common tuning shaft to produce a uniform transfer characteristic over the entire ultra high frequency television band.

The invention, both as to its organization and method of operation, together with further objects and advantages thereof, will best be understood by reference to the following specification taken in connection with the accompanying drawings, in which.

Figures 1, 3:
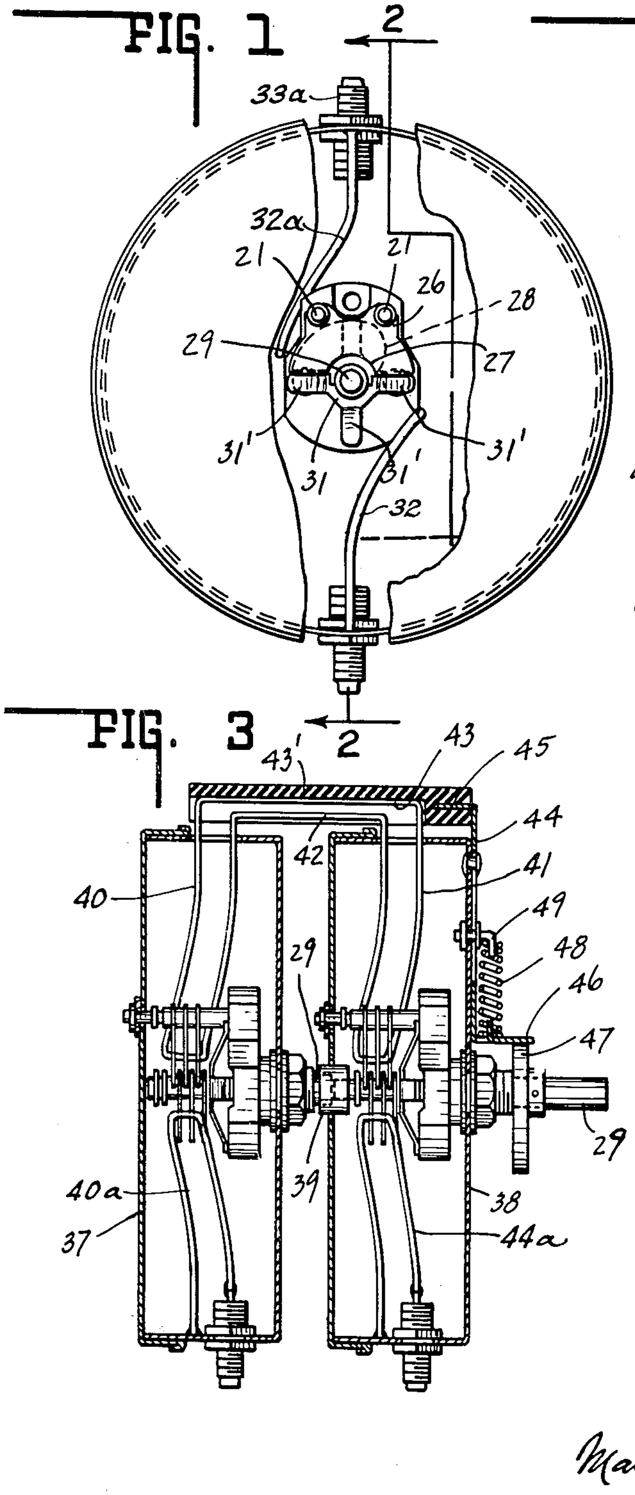
Fig. 1 is a front elevational view of a tuning unit embodying the principles of the present invention, a portion of one wall thereof being broken away.
Fig. 3 is a sectional view showing two tuning units connected in ganged relation and provided with adjustable coupling means.
Figure 2:
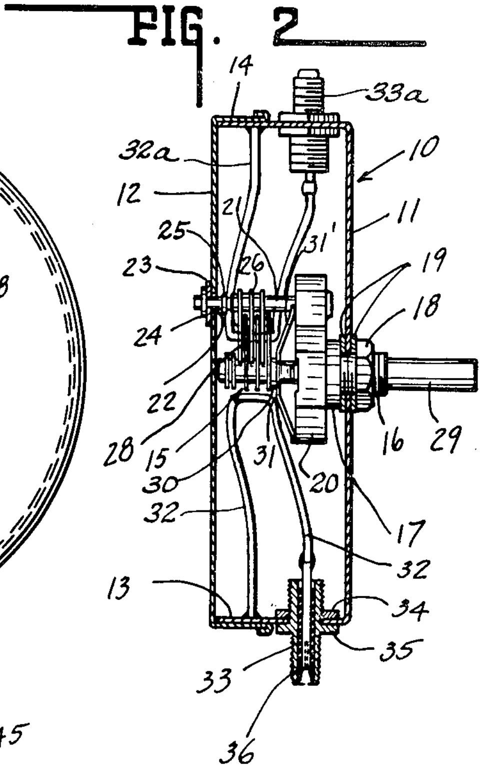
Fig. 2 is a sectional view taken along the line 2—2 of Fig. 1.

Referring now to the drawings and more particularly to Figs. 1 and 2 thereof, the tuning unit of the present invention includes a casing indicated generally at 10, which, in the present instance, comprises a flat cylindrical casing formed of two telescoping sections 11 and 12 having respectively side walls 13 and 14 telescoping and fixedly connected together. In the structure illustrated, the casing is formed entirely of a conducting material such as aluminum, the side walls being fixedly secured together as by soldering or the like to form a completely shielded casing. It is possible, however, that the casing may be formed of a non-conductive material and have the inner surface thereof coated with a relatively thin layer of any suitable conducting material.

Within the casing 10 there is provided a variable condenser indicated generally at 15. The condenser 15 is of the general type commonly referred to as a "trimmer" condenser and includes a bearing having a threaded end 16 which extends through the end wall 11 of the casing. The bearing is provided with an integral shoulder 17 with abuts the inner face of the wall 11 and is secured in position by threading a clamping nut 18 on the extending threaded end 16 of the bearing. Suitable lock washers 19 are interposed between the shoulder 17 and the wall and between the nut 18 and the wall to secure the parts in position.

An insulating support member 20 is mounted on the bearing within the casing 10 and this support member carries the stator plate supporting posts 21 which extend parallel to the axis of the bearing 16 and have their opposite ends electrically connected to the opposite end wall 12 of the casing. This connection may, if desired, be effected by providing the end wall 12 with openings such as 22 through which the supporting posts 21 extend so as to receive on their outer ends clamping washers 23 and holding rings 24, which rings engage in annular grooves in the ends of the posts 21. The posts 21 are mounted on the insulating member 20 and are secured in position by suitable clamping washers and an appropriate sealing compound.

The stator plates 25, of which in the present instance there are three, are arcuate in form and are provided with oppositely extending securing ears 26, notched to receive the posts 21 and adapted to fit into spaced grooves in the posts. The notches in the ears 26, after the plates have been positioned, may be squeezed shut firmly to lock the plates to the posts. The bottom face of each of the plates is recessed as at 27 to accommodate the rotating shaft carrying the rotor plates 28 of the condenser. The rotor plates 28 are supported on the rotatable shaft 29 which extends through the bearing 16 and on its inner end is provided with spaced apart grooves in each of which is fitted the holding lugs of the rotor plates 28. The rotor plates 28 are of suitable shape to provide the desired frequency characteristic throughout the ultra high frequency band, as will be described in more detail hereinafter, and are provided with small ears which embrace the shaft and are pinched down on the shaft to lock the rotor plates in position. The shaft 29 is prevented from axial displacement in its bearings through the medium of the spring washer 31 threaded on to the shaft and bearing against the collar 30 thereon. This washer is provided with radially disposed tongues 31' which bear against the face of the insulating member 20.

From the foregoing description, it will be evident that the stator plates 25 are electrically connected to the end wall 12 of the casing by means of the supporting posts 21 and the rotor plates 28 are connected to the other end wall 11 of the casing through the rotor shaft 29 and the bearing structure 16. The stator plates 25 and cooperating rotor plates 28, which are thus electrically connected to the central portion of the opposed walls 11 and 12 of the casing, together with the end and side walls of the cavity form a tuned circuit, the resonant frequency of which may be varied throughout the television band of 470 megacycles to 890 megacycles by rotation of the tuning shaft 29 so that the rotor plates 28 are positioned in variable capacitive relation to the stator plates 35.

In order to couple energy to the above described tuned circuit, there is provided a coupling loop 32 having one end thereof electrically connected to the side wall 13 of the casing 10 and the opposite end extends through an insulator projecting through the wall 13 of the casing 10. This insulator comprises a hollow metal tube 33 screw-threaded on its exterior which is adapted to be projected through the wall of the casing and which includes a clamping flange 35 which cooperates with a clamping nut 34 to secure the insulator tube 33 to the wall 13. The interior of the tube 33 is filled with a suitable insulating material 36 in which the end of the loop 32 may be positioned and electrical contacts may be made by any suitable means from this end of the loop to the remainder of the circuit as will be described in more detail hereinafter. In order to extract energy from the tuned circuit, there is provided a similar coupling loop 32a which is positioned in the opposed side wall 14 of the casing 10, suitable connection being made from the central stud of the insulator tube 33a to the external circuit.

In accordance with an important feature of the present invention, the inner walls of the casing 10 define a resonant cavity or resonator having a natural resonant frequency which is independent of the frequency to which the above described tuned circuit is tuned within the ultra high frequency television band. In order to prevent spurious modes of oscillation from being set up due to the natural resonance of the above described cavity, the natural resonant frequency thereof is chosen sufficiently higher than the highest frequency in the ultra high frequency television band so that production of spurious modes of oscillation is prevented within this band. Since the natural resonant frequency of this cavity is dependent upon the physical dimensions thereof, it will be evident that the maximum size of this cavity is limited to a particular value at which the natural resonant frequency of the cavity is sufficiently above the ultra high frequency television band to prevent interference therewith and interaction upon the tuned circuit.

In order to provide for the efficient transfer of energy to, and extraction of energy from, the tuned circuit, the coupling loops 32 and 32a are preferably positioned closely adjacent to the rotor and stator plates 25 and 28 of the condenser on opposite sides thereof.

In Fig. 3 there is illustrated an arrangement wherein two of the tuning units illustrated in Fig. 1 and Fig. 2 are connected in ganged relation and means are provided for adjustably coupling energy from one tuning unit to the other. In the arrangement of Fig. 3 the tuning units 37 and 38 are of the same construction as that described in connection with Figs. 1 and 2. However, the condenser adjusting shafts 29 of the two tuning units are coaxially aligned and are coupled together by means of a suitable coupling 39 so that in effect a common tuning shaft is provided whereby the rotor plates of the two tuning units may be operated in unison. Energy may be coupled into the first tuning unit 37 by means of the coupling loop 40a, and extracted from the second tuning unit 38 by means of a coupling loop 44a.

In order to couple energy between the tuning units 37 and 38 the coupling loops 40 and 41 are provided which respectively extend into the cavities 37 and 38 adjacent the tuned circuits therein and are connected together by means of the conductors 42 and 43 so as to provide a low impedance coupling circuit between the tuning circuit 37 and 38. The coupling loops 40 and 41 are mounted on a suitable insulating base member 43' which is disposed exteriorly of the respective tuning units and is carried on an adjustable arm 44 slidably mounted on the end wall of the tuning unit 38. The arm 44 is provided with an inturned lug 45 at one end which is inserted in the base member 43' and is provided at the other end thereof with an out turned lug or arm 46 which bears on a cam 47 fixedly mounted on the tuning shaft 29. The arm 44 is biased inwardly by means of the coiled spring 48 connected at one end to the stop 49 on the end wall of the casing 38 and at the other end to the arm 46. With this arrangement, as the tuning units are varied by rotation of the tuning shaft 29, the positioning of the coupling loops 40 and 41 relative to their respective tuned circuits is likewise varied so as to provide for variable coupling between these tuned circuits. In this connection it will be understood that the transfer characteristic between these tuned circuits may not be linear throughout the entire ultra high frequency band, and by providing the above described variable coupling arrangement, compensation is provided for a non-linear frequency characteristic. In the illustrated arrangement the coupling loops 40 and 41 are positioned relatively close to the tuned circuits 37 and 38 at the high end of the band, i. e., when the condenser plates thereof are separated by the maximum amount. As the shaft 29 is rotated so as to move the rotor plates within the respective stator plate groups so as to lower the frequency of the tuned circuits, the coupling loops 40 and 41 are automatically moved farther away from their respective tuned circuits so as to reduce the coupling of energy from one tuned circuit to the other. Accordingly, compensation is made for a frequency characteristic which is greater at the low end of the band than at the high frequency end thereof.

It will be understood that additional tuning units such as units 37 and 38, may be positioned in coaxial alignment to provide a three or four unit ganged arrangement. Furthermore, it will be understood that the tuning units may be utilized for any suitable tuning function in the television receiver. Thus, the tuning unit 37 may be employed as an antenna tuning unit and energy from the receiving antenna may be coupled through the loop 40a to the tuned circuit of this unit. Likewise, the tuning unit 38 may be employed as a mixing unit and energy may be coupled from the antenna tuning unit 37 to the mixer tuning unit 38 by means of the coupling loop arrangement 40, 41. It also will be understood that a suitable local oscillator voltage may be coupled into the mixer tuning unit 38 by any suitable coupling loop (not shown) and intermediate frequency energy may be extracted from the mixer tuning unit 38 by means of the coupling loop 44a. Furthermore, a suitable mixer tube such as a crystal or high vacuum tube, may be connected to the loop 44a exteriorly of the tuning unit 38 so as to derive a suitable intermediate frequency which may be supplied to the input circuit of the television receiver.

While particular embodiments of the invention have been shown, it will be understood, of course, that the invention is not limited thereto since many modifications may be made and it is therefore contemplated by the appended claims to cover any such modifications as fall within the true spirit and scope of the invention.

What is claimed as new and desired to be secured by Letters Patent is:

1. An ultra high frequency tuner for tuning through the television band of 470 to 890 megacycles, comprising means defining a resonant cavity having the walls thereof formed of a conductive material, a set of stator condenser plates conductively connected to one wall of said cavity at the central portion thereof, a set of rotor condenser plates arranged to interleave with said stator plates in variable capacity relation and conductively connected to the opposite wall of said cavity at the central portion thereof, said stator and rotor plates together with the walls of said cavity forming a tuned circuit the resonant frequency of which may be varied throughout said television band by rotation of said rotor plates, and means including a coupling loop extending into said cavity and positioned adjacent said rotor and stator plates for coupling energy to said tuned circuit, the natural resonant frequency of said cavity considered independently of said rotor and stator plates being higher than the highest frequency in said television band to prevent spurious modes of oscillation from being set up within said cavity upon coupling of energy to said condenser.

2. An ultra high frequency tuner for tuning through the ultra high frequency television band, comprising a cylindrical casing having end and side walls defining a cavity, the interior of said walls being formed of conducting material, a shaft bearing extending through one of the side walls of said casing and a shaft rotatably mounted within said bearing and projecting into said cavity, said shaft and bearing being conductively connected to the conducting material of said side wall, a plurality of rotor plates carried by said shaft in spaced relation, an insulating base mounted on said bearing, a pair of stator supporting posts mounted on said base and extending parallel to the axis of said shaft and conductively connected to the conducting material of the opposite side wall, and a plurality of stator plates supported from said posts in spaced relation adapted to be intermeshed with the rotor plates carried by said shaft, a pair of oppositely disposed coupling loops extending into said cavity from the side walls of the casing having a portion thereof positioned adjacent said rotor and stator plates, one end of each of said loops being connected to the conducting material of the interior of the casing, and the opposite ends of said loops extending through the side walls of the casing and insulated therefrom and adapted for circuit connection.

3. An ultra high frequency tuner for tuning through the ultra high frequency television band, comprising a casing having the interior thereof formed of conducting material defining a cavity therein, a variable condenser mounted within said casing having a rotor rotatably mounted upon one of the side walls of said casing and electrically connected to the conducting material thereof and a stator cooperatively associated with said rotor and electrically connected to the conducting material of the opposite side wall of the casing, oppositely disposed coupling loops extending into said cavity, and means for varying the extent of projection of at least one of said loops into said cavity in accordance with rotation of said rotor.

4. An ultra high frequency tuner for tuning through the ultra high frequency television band, comprising a pair of tuning units, each comprising a cylindrical casing having the inner walls thereof formed of conducting material defining a cavity therein, each casing having a variable air condenser comprising a rotor rotatably supported upon one wall of said casing and electrically connected to the conducting material thereof and a stator cooperatively associated with said rotor and electrically connected to the conducting material of the opposite wall thereof, means for rotating the rotors of said two tuning units in unison, means including a coupling loop projecting into each of said cavities for coupling energy therebetween, and means for adjusting the extent of projection of said loops into said cavities simultaneously with rotation of said rotors.

References Cited in the file of this patent

UNITED STATES PATENTS

| | | |
|---|---|---|
| 1,577,613 | Dunmore | Mar. 23, 1926 |
| 2,194,696 | Eickemeyer et al. | Mar. 26, 1940 |
| 2,272,062 | George | Feb. 3, 1942 |
| 2,513,761 | Tyson | July 4, 1950 |
| 2,520,614 | Sproull | Aug. 29, 1950 |
| 2,557,969 | Isely | June 26, 1951 |
| 2,609,449 | Otis et al. | Sept. 2, 1952 |
| 2,613,269 | Stockman | Oct. 7, 1952 |